United States Patent
Tayebati

(10) Patent No.: US 6,996,144 B2
(45) Date of Patent: *Feb. 7, 2006

(54) WAVELENGTH STABILIZATION OF TUNABLE LASERS BY CURRENT MODULATION

(75) Inventor: Parviz Tayebati, Boston, MA (US)

(73) Assignee: Nortel Networks Ltd., St. Laurent (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/827,715

(22) Filed: Apr. 20, 2004

(65) Prior Publication Data

US 2004/0196875 A1    Oct. 7, 2004

Related U.S. Application Data

(63) Continuation of application No. 09/697,198, filed on Oct. 26, 2000, now Pat. No. 6,744,792.

(60) Provisional application No. 60/161,499, filed on Oct. 26, 1999.

(51) Int. Cl.
*H01S 3/00*      (2006.01)
*H01S 3/10*      (2006.01)
*H01S 3/091*     (2006.01)
*H01S 3/092*     (2006.01)
*H01S 3/094*     (2006.01)

(52) U.S. Cl. .................. 372/38.06; 372/20; 372/28; 372/70; 372/71; 372/75

(58) Field of Classification Search ............. 372/29.02, 372/38.01, 38.02, 38.07, 70, 75, 20, 28, 38.06, 372/71

See application file for complete search history.

(56) References Cited

U.S. PATENT DOCUMENTS

| | | | | | |
|---|---|---|---|---|---|
| 5,317,447 | A | * | 5/1994 | Baird et al. ................. | 359/328 |
| 5,381,428 | A | * | 1/1995 | McMahon et al. ............ | 372/20 |
| 5,450,207 | A | * | 9/1995 | Fomenkov ................... | 356/416 |
| 5,691,989 | A | * | 11/1997 | Rakuljic et al. .............. | 372/20 |
| 5,822,345 | A | * | 10/1998 | Sousa et al. ............. | 372/38.06 |
| 5,970,076 | A | * | 10/1999 | Hamada ...................... | 372/20 |
| 5,982,790 | A | * | 11/1999 | Grossman et al. ............ | 372/25 |
| 5,999,548 | A | * | 12/1999 | Mori et al. ................... | 372/22 |
| 6,289,028 | B1 | * | 9/2001 | Munks et al. ................. | 372/20 |

* cited by examiner

*Primary Examiner*—Wilson Lee
*Assistant Examiner*—Leith Al-Nazer
(74) *Attorney, Agent, or Firm*—John C. Gorecki, Esq.

(57) ABSTRACT

Apparatus and method for stabilizing the wavelength of a tunable laser to a target wavelength, by correspondingly adjusting the electrooptical performance of the laser's gain medium, whereby to eliminate the frequency shift due to vibrational factors. The electrooptical performance of the laser's gain medium is adjusted, in the case of an electrically pumped laser, by changing the injection current used to pump the laser; and the electrical performance of the laser's gain medium is adjusted, in the case of an optically pumped laser, by changing the intensity of the pump laser used to energize the laser. The system is implemented with a feedback mechanism.

16 Claims, 3 Drawing Sheets

WAVELENGTH STABILIZATION OF TUNABLE LASERS BY CURRENT MODULATION

REFERENCE TO PENDING PRIOR PATENT APPLICATION

This patent application is a continuation of U.S. patent application Ser. No. 09/697,198, now U.S. Pat. No. 6,744,792, which claims benefit of pending prior U.S. Provisional Patent Application Ser. No. 60/161,499, filed Oct. 26, 1999 by Parviz Tayebati for WAVELENGTH STABILIZATION OF TUNABLE LASERS BY CURRENT MODULATION, which patent application is hereby incorporated herein by reference.

FIELD OF THE INVENTION

This invention relates to photonic devices in general, and more particularly to tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent application Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium 55 between bottom mirror 20 and bottom electrode 15. As a result, when gain medium 55 is appropriately stimulated, e.g., by optical pumping or by electrical pumping, lasing can be established between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune laser 50.

The present invention is directed to tunable lasers of the type disclosed in the aforementioned U.S. patent application Ser. Nos. 09/105,399 and 09/543,318.

Tunable lasers of the type disclosed in the aforementioned U.S. patent application Ser. Nos. 09/105,399 and 09/543,318 are highly advantageous since they can be quickly and easily tuned by simply changing the voltage applied across the top electrode and the bottom electrode.

However, it has been found that tunable lasers of the type disclosed in the aforementioned U.S. patent application Ser. Nos. 09/105,399 and 09/543,318 can suffer from vibrational problems.

The aforementioned vibrational problems may be due to a variety of factors, such as thermal noise; or noise in the tuning voltage of the laser; or, in the case of an electrically pumped laser, shot noise in the injection current; etc.

Regardless of the cause, the effect of these vibrational problems is to cause the laser to move out of tune. In other words, these vibrational effects cause the output frequency of the laser to change even though the tuning voltage of the laser is held constant. While the extent of this vibration-related frequency shift may be relatively modest (e.g., a 300 MHz shift in the lasing frequency from a 100 MHz vibration frequency), this frequency shift may nonetheless create significant problems in certain types of systems, e.g., WDM communication systems.

See, for example, FIG. 3, which schematically illustrates how the aforementioned vibrational problems may cause a relatively periodic modulation of the lasing frequency; and FIG. 4, which schematically illustrates how the aforementioned vibrational problems may cause a relatively irregular modulation of the lasing frequency.

As a result, an object of the present invention is to provide a method and apparatus for stabilizing the wavelength of tunable lasers affected by the aforementioned vibrational problems.

SUMMARY OF THE INVENTION

The present invention provides a fast and easy way to compensate for the aforementioned vibrational problems in tunable lasers, by correspondingly adjusting the electrooptical performance of the laser's gain medium, whereby to eliminate the frequency shift due to vibrational factors.

The electrooptical performance of the laser's gain medium is adjusted, in the case of an electrically pumped laser, by changing the injection current used to pump the laser; and the electrical performance of the laser's gain medium is adjusted, in the case of an optically pumped laser, by changing the intensity of the pump laser used to energize the laser.

The system is implemented with a feedback mechanism. A wavelength measuring module detects the difference between the instantaneous wavelength of the laser and the desired wavelength of the laser, and generates a voltage signal which is representative of this difference. This voltage signal is then used to appropriately modify the electrooptical performance of the laser's gain medium, either by appropriately adjusting the injection current applied to the gain medium (in the case of an electrically pumped laser), or by appropriately adjusting the intensity of the pump laser applied to the gain medium (in the case of an optically pumped laser).

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
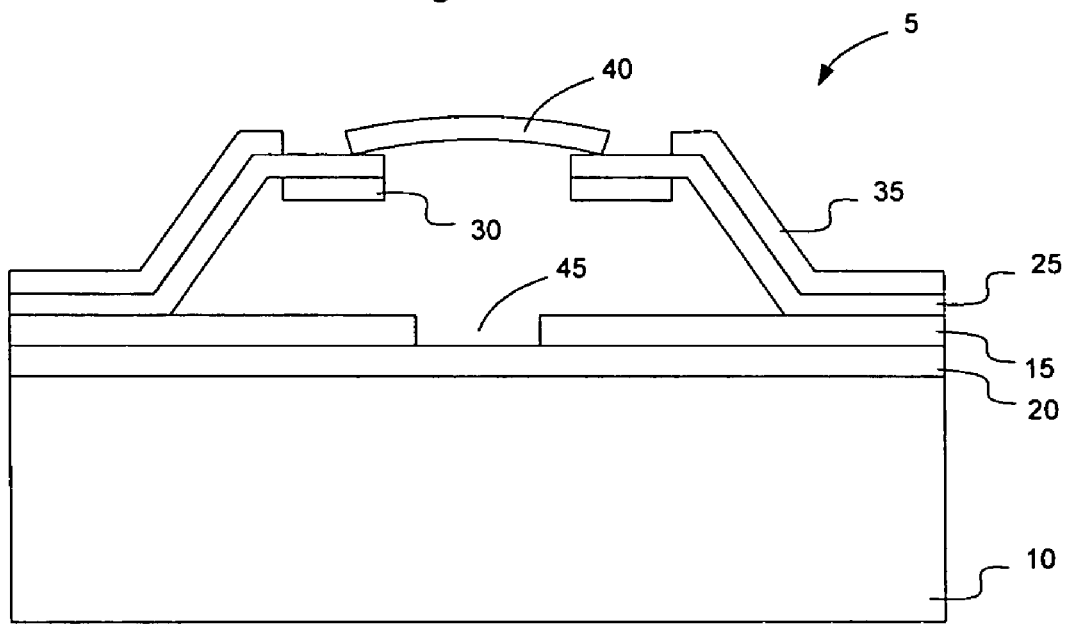
FIG. 1 is a schematic side view of a tunable Fabry-Perot filter.
Figure 2:
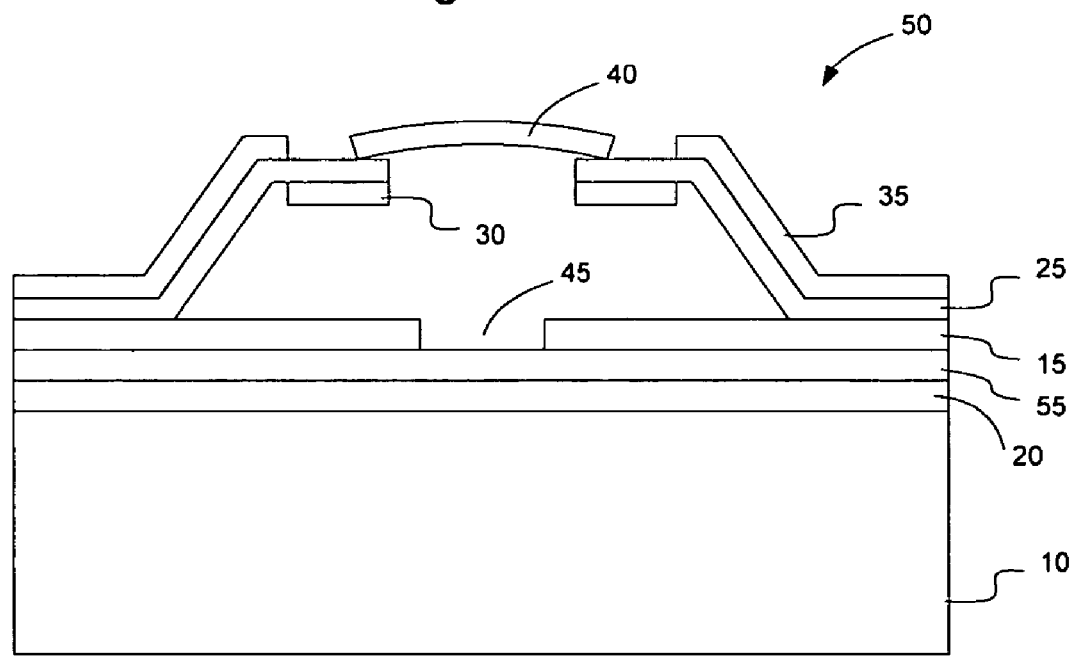
FIG. 2 is a schematic side view of a tunable VCSEL.
Figure 3:
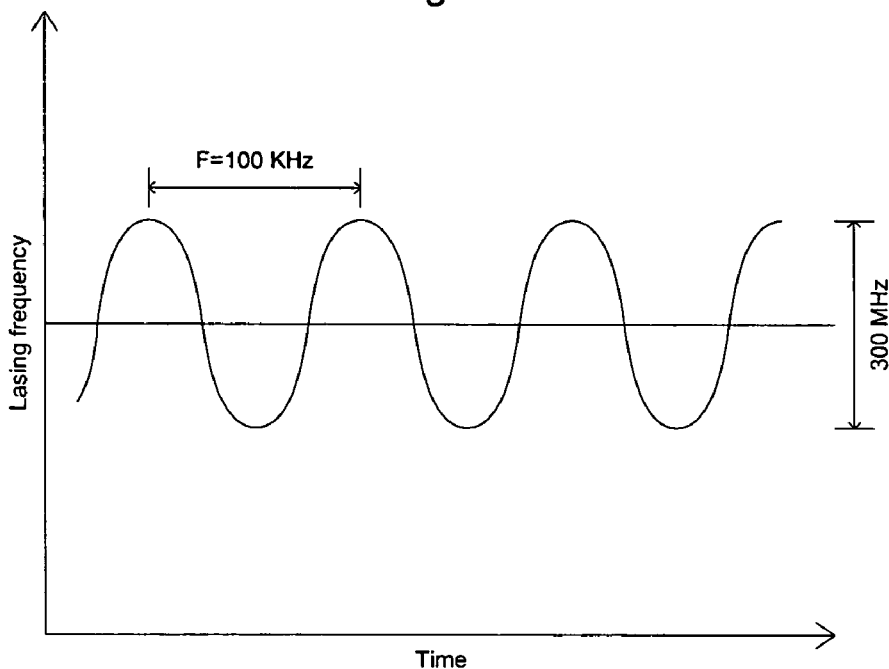
FIG. 3 is a schematic diagram illustrating how the aforementioned vibrational problems may cause a relatively periodic modulation of the lasing frequency of a laser.
Figure 4:
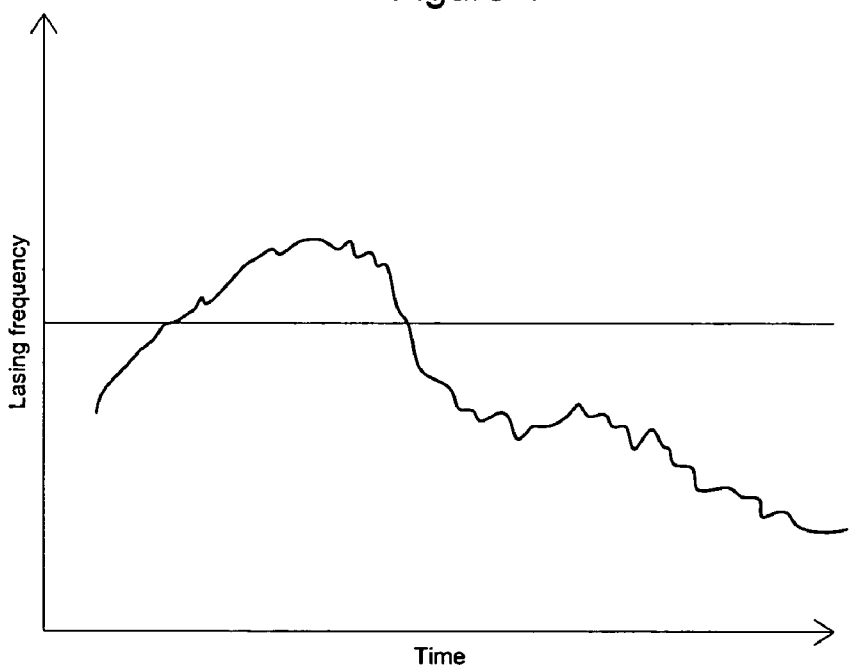
FIG. 4 is a schematic diagram illustrating how the aforementioned vibrational problems may cause a relatively irregular modulation of the lasing frequency of a laser.

The present invention provides a fast and easy way to compensate for the aforementioned vibrational problems in tunable lasers, by correspondingly adjusting the electrooptical performance of the laser's gain medium, whereby to eliminate the frequency shift due to vibrational factors.

More particularly, in a tunable laser of the sort disclosed in the aforementioned U.S. patent application Ser. Nos. 09/105,399, and 09/543,318, the output frequency of the laser may be affected by three variables, among others: (1) the tuning voltage applied to the laser, in the case of both electrically pumped and optically pumped lasers; (2) the injection current applied to the laser's gain medium, in the case of an electrically pumped laser; and (3) the intensity of the pump laser applied to the laser's gain medium, in the case of an optically pumped laser.

In particular, in the case of an electrically pumped laser, changing the injection current applied to the laser's gain medium causes a change in both the intensity of the laser's output and the output frequency of the laser. This is due to a corresponding change in the electrooptical performance of the laser's gain medium.

And in the case of an optically pumped laser, changing the intensity of the pump laser applied to the laser's gain medium causes a change in both the intensity of the laser's output and the output frequency of the laser. Again, this is due to a corresponding change in the electrooptical performance of the laser's gain medium.

The present invention is adapted to utilize one or the other of these phenomena, depending on whether the laser is electrically pumped or optically pumped, to selectively adjust the electrooptical performance of the laser's gain medium, whereby to eliminate the frequency shift due to the aforementioned vibrational factors.

More specifically, the present invention is adapted to (1) detect the frequency shift due to vibrational factors, and (2) compensate for this frequency shift by selectively modifying the electrooptical performance of the laser's gain medium, whereby to lock the laser to its target frequency. In the case of an electrically pumped laser, this compensation is achieved by appropriately adjusting the injection current applied to the laser's gain medium; in the case of an optically pumped laser, this compensation is achieved by selectively adjusting the intensity of the pump laser applied to the laser's gain medium.

The system is implemented with a feedback mechanism. More particularly, a wavelength measuring module detects the difference between the instantaneous wavelength of the tunable laser and the desired wavelength of the laser, and generates a voltage signal which is representative of this difference. This voltage signal is then used to appropriately modify the electrooptical performance of the laser's gain medium, either by appropriately adjusting the injection current applied to the gain medium (in the case of an electrically pumped laser), or by appropriately adjusting the intensity of the pump laser applied to the gain medium (in the case of an optically pumped laser).

The particular wavelength measuring module used for the feedback mechanism can be any one of the many such devices well known in the art.

Figure 5:
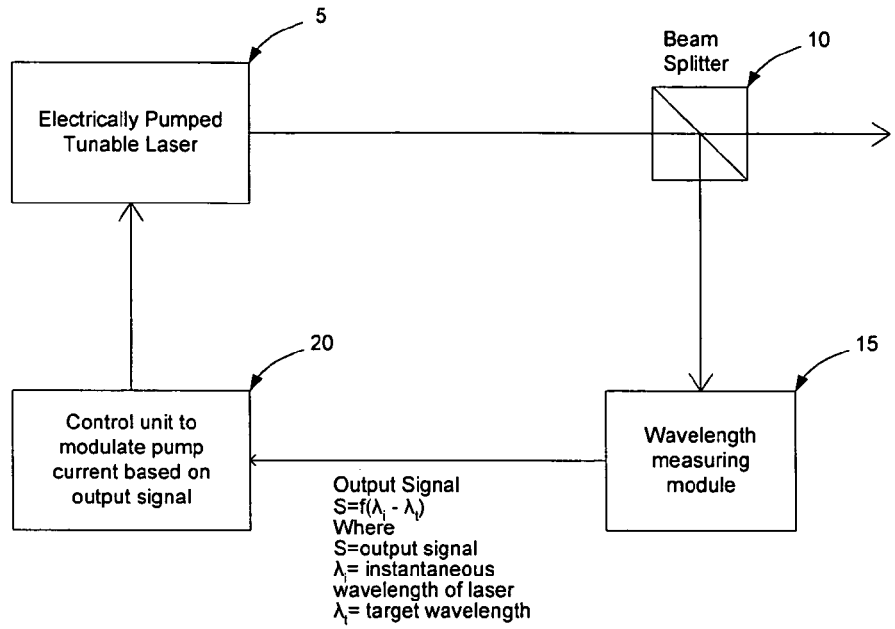
FIG. 5 is a schematic diagram of a system for stabilizing the wavelength of an electrically pumped tunable laser.

Looking now at FIG. 5, there is shown a preferred system for stabilizing the wavelength of an electrically pumped tunable laser 5. More particularly, the output of laser 5 is passed to a beamsplitter 10, where a portion of the laser's output is directed to a wavelength measuring module 15. Wavelength measuring module 15 is adapted to generate an output signal which is a function of the difference between the instantaneous wavelength of the tunable laser and the target wavelength of the laser. Preferably this output signal is in the form of a voltage signal whose magnitude varies according to the difference between the instantaneous wavelength of the tunable laser and the target wavelength of the laser. The output signal from wavelength measuring module 15 is then fed to a control unit 20, which modulates the pump current applied to tunable laser 5 according to the output signal of wavelength measuring module 15, whereby to keep tunable laser 5 locked to its target frequency.

Figure 6:
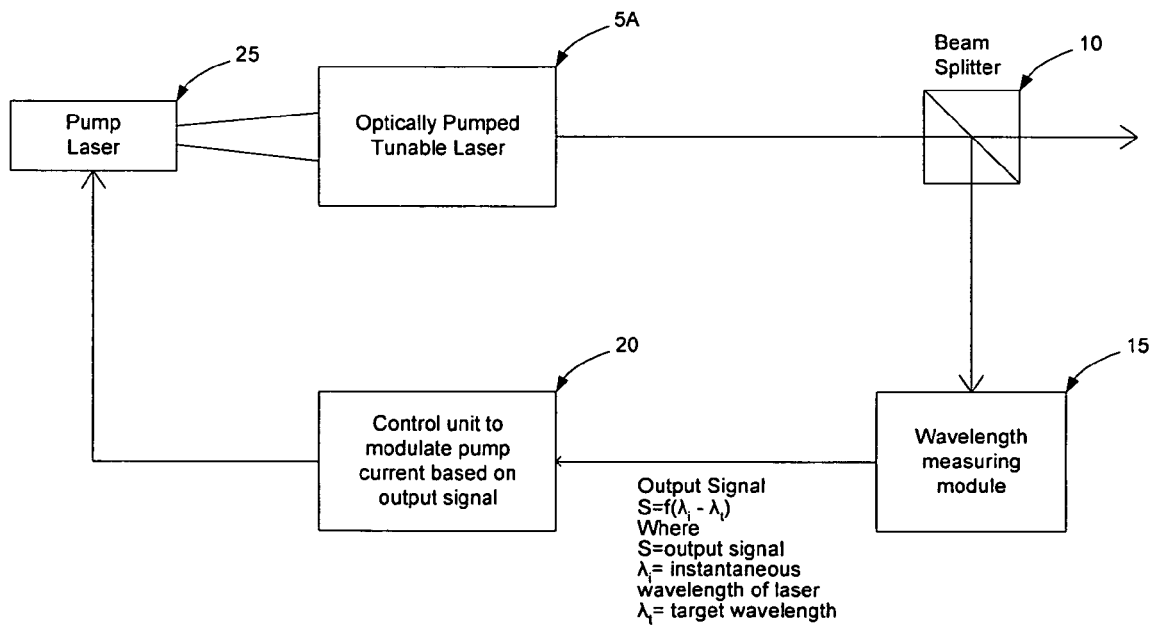
FIG. 6 is a schematic diagram of a system for stabilizing the wavelength of an optically pumped tunable laser.

Correspondingly, and looking now at FIG. 6, there is shown a preferred system for stabilizing the wavelength of an optically pumped laser 5A. More particularly, the output of laser 5A is passed to a beamsplitter 10, where a portion of the laser's output is directed to a wavelength measuring module 15. Wavelength measuring module 15 is adapted to generate an output signal which is a function of the difference between the instantaneous wavelength of the tunable laser and the target wavelength of the laser. Preferably this output signal is in the form of a voltage signal whose magnitude varies according to the difference between the instantaneous wavelength of the tunable laser and the target wavelength of the laser. The output signal from wavelength measuring module 15 is then fed to a control unit 20, which modulates the pump current of a pump laser 25 according to the output signal of wavelength measuring module 15, whereby to keep the tunable laser locked to its target frequency.

It is to be understood that the present invention is by no means limited to the particular constructions and method steps disclosed above and/or shown in the drawings, but also comprises any modifications or equivalents within the scope of the claims.

What is claimed is:

1. A method of adjusting an output of an optically pumped tunable laser, the method comprising the steps of:
   providing an optical pump signal to the optically pumped tunable laser;
   measuring an output of the optically pumped tunable laser to form a feedback signal, said feedback signal being based on an a difference between a wavelength of lasing of the optically pumped tunable laser and a target wavelength of the optically pumped tunable laser; and adjusting the optical pump signal in accordance with the feedback signal and providing the adjusted optical pump signal to the optically pumped tunable laser to adjust the wavelength of lasing of the optically pumped tunable laser.

2. The method of claim 1, wherein the target wavelength of the optically pumped tunable laser is based on an intended tuned output wavelength of the optically pumped tunable laser.

3. The method of claim 1, wherein the step of measuring the output of the optically pumped tunable laser comprises directing at least a portion of the output of the optically pumped tunable laser to a wavelength measuring module, and wherein the step of measuring the output is performed by the wavelength measuring module.

4. The method of claim 1, wherein the optical pump signal is generated by an optical pump laser, and wherein the step of adjusting the optical pump signal comprises adjusting an output of the optical pump laser.

5. The method of claim 4, wherein the optical pump laser is an electrically pumped optical pump laser, and wherein the step of adjusting the optical pump signal comprises adjusting an electrical pump signal to the electrically pumped optical pump laser.

6. The method of claim 1, wherein the step of adjusting the optical pump signal is used to compensate for wavelength variations produced by mechanical vibration of the laser.

7. The method of claim 1, wherein the laser is a Vertical Cavity Surface Emitting Laser (VCSEL).

8. An output stabilized tunable laser, comprising:
an optically pumped tunable lasing cavity having a lasing output and an input configured to receive an optical pump signal;
a wavelength measuring module configured to measure a wavelength of light emitted from the lasing output;
a control unit configured to adjust the optical pump signal based on the measured wavelength to adjust the wavelength of light emitted from the lasing output; and
a pump laser connected to the control unit and configured to generate the optical pump signal.

9. The output stabilized tunable laser of claim 8, further comprising:
a pump laser configured to generate the optical pump signal and connected to the control unit.

10. The output stabilized tunable laser of claim 9, further comprising a beam splitter configured to direct a portion of the beam to the wavelength measuring module.

11. The output stabilized tunable laser of claim 9, wherein the control unit enables the output to be stabilized to compensate for wavelength variations produced by mechanical vibration in the laser structure.

12. The output stabilized tunable laser of claim 9, wherein the output stabilized tunable laser is a Vertical Cavity Surface Emitting Laser (VCSEL).

13. The output stabilized tunable laser of claim 8, wherein the wavelength measuring module is configured to measure an instantaneous lasing wavelength of the output waveform.

14. The output stabilized tunable laser of claim 13, wherein the control unit is configured to adjust an output of the pump laser to adjust the optical pump signal.

15. The output stabilized tunable laser of claim 13, wherein the wavelength measuring module is configured to compare the instantaneous lasing wavelength of the output waveform with a target wavelength of the tunable laser.

16. The output stabilized tunable laser of claim 15, wherein the target wavelength of the tunable laser is based on an intended tuned output wavelength of the tunable laser.

* * * * *